United States Patent
Yang

(10) Patent No.: US 11,069,611 B2
(45) Date of Patent: Jul. 20, 2021

(54) LINER-FREE AND PARTIAL LINER-FREE CONTACT/VIA STRUCTURES

(71) Applicant: International Business Machines Corporation, Armonk, NY (US)

(72) Inventor: Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/685,780

(22) Filed: Nov. 15, 2019

(65) Prior Publication Data

US 2020/0091067 A1 Mar. 19, 2020

Related U.S. Application Data

(63) Continuation of application No. 16/035,067, filed on Jul. 13, 2018, now Pat. No. 10,546,812.

(51) Int. Cl.
*H01L 23/52* (2006.01)
*H01L 23/522* (2006.01)
*H01L 23/532* (2006.01)
*H01L 21/768* (2006.01)

(52) U.S. Cl.
CPC .... *H01L 23/5226* (2013.01); *H01L 21/76808* (2013.01); *H01L 23/53223* (2013.01); *H01L 23/53238* (2013.01); *H01L 23/53266* (2013.01)

(58) Field of Classification Search
CPC ........... H01L 21/76808; H01L 23/5226; H01L 23/53223; H01L 23/53238; H01L 23/53266

USPC ......................................................... 257/774
See application file for complete search history.

(56) References Cited

U.S. PATENT DOCUMENTS

| | | | |
|---|---|---|---|
| 6,380,065 B1 | 4/2002 | Komai et al. | |
| 7,651,942 B2 | 1/2010 | Huebinger et al. | |
| 7,846,817 B2 | 12/2010 | Yamazaki et al. | |
| 8,034,712 B2 | 10/2011 | Chang et al. | |
| 8,178,379 B2 * | 5/2012 | Blanchard | H01L 45/085 438/51 |
| 8,847,192 B2 | 9/2014 | Lee et al. | |
| 9,252,359 B2 | 2/2016 | Jameson, III et al. | |
| 9,293,412 B2 * | 3/2016 | Bao | H01L 23/53228 |
| 9,305,937 B1 | 4/2016 | Tsutsumi et al. | |
| 9,355,895 B2 | 5/2016 | Ebefors et al. | |
| 9,583,386 B2 | 2/2017 | Kolics et al. | |
| 9,583,417 B2 | 2/2017 | Sun et al. | |
| 2007/0082477 A1 | 4/2007 | Naik et al. | |
| 2016/0064648 A1 | 3/2016 | Tsubata et al. | |
| 2017/0053967 A1 | 2/2017 | Chuang et al. | |
| 2017/0338412 A1 | 11/2017 | Liu et al. | |
| 2017/0352804 A1 | 12/2017 | Chuang et al. | |
| 2018/0040814 A1 | 2/2018 | Park | |

OTHER PUBLICATIONS

List of IBM Patents or Patent Applications Treated as Related dated Nov. 15, 2019, 2 pages.

* cited by examiner

*Primary Examiner* — Luan C Thai
(74) *Attorney, Agent, or Firm* — Scully, Scott, Murphy & Presser, P.C.; L. Jeffrey Kelly, Esq.

(57) ABSTRACT

A liner-free or partial liner-free contact/via structure that is embedded within a dielectric capping layer and positioned between an electrically conductive structure and an overlying contact structure is provided.

15 Claims, 6 Drawing Sheets

LINER-FREE AND PARTIAL LINER-FREE CONTACT/VIA STRUCTURES

BACKGROUND

The present application relates to a semiconductor structure and a method of forming the same. More particularly, the present application relates to a semiconductor structure including a liner-free or partial liner-free contact/via structure that is embedded within a dielectric capping layer and positioned between an electrically conductive structure and an overlying contact structure.

Generally, BEOL interconnect devices include a plurality of circuits which form an integrated circuit fabricated on a BEOL interconnect substrate. A complex network of signal paths will normally be routed to connect the circuit elements distributed on the surface of the substrate. Efficient routing of these signals across the device requires formation of multilevel or multilayered schemes, such as, for example, single or dual damascene wiring, i.e., interconnect, structures.

Within typical BEOL interconnect structures, electrically conductive metal vias run perpendicular to the BEOL interconnect substrate and electrically conductive metal lines run parallel to the BEOL interconnect substrate. Typically, the electrically conductive metal vias are present beneath the electrically conductive metal lines and both features are embedded within an interconnect dielectric material layer.

In multilayered BEOL interconnect structures, a dielectric capping layer containing a contact/via opening is located between a lower interconnect dielectric material and an upper interconnect dielectric material. Compared to both the lower and upper interconnects, liner/barrier volume fraction increases faster inside the contact/via feature, while scaling the overall BEOL dimensions. Accordingly, it would be beneficial to decouple the metallization process between line and via features in order to optimize the overall BEOL interconnect performance.

SUMMARY

A liner-free or partial liner-free contact/via structure that is embedded within a dielectric capping layer and positioned between an electrically conductive structure and an overlying contact structure is provided.

In one aspect of the present application, a semiconductor structure is provided. In one embodiment, the semiconductor structure includes a lower portion of a volume expanded electrically conductive structure embedded in a first dielectric material layer. A dielectric capping layer is located on the first dielectric material layer. The dielectric capping layer has a contact/via opening comprising a lower portion and an upper portion, wherein the lower portion of the contact/via opening contains an upper portion of the volume expanded electrically conductive structure. A contact/via diffusion barrier liner and a contact/via structure are present in the upper portion of the contact/via opening. A contact structure is located above the dielectric capping layer, the contact/via diffusion barrier liner, and the contact/via structure, wherein the contact structure is embedded in a second dielectric material layer. In some embodiments, a gap is located beneath the dielectric capping layer. When present, the gap separates the dielectric capping layer from a surface of the lower portion of the volume expanded electrically conductive structure embedded in the first dielectric material layer.

In another embodiment, the semiconductor structure includes a lower portion of a volume expanded electrically conductive structure embedded in a first dielectric material layer. A dielectric capping layer is located on the first dielectric material layer. The dielectric capping layer has a contact/via opening that is entirely filled with an upper portion of the volume expanded electrically conductive structure. A contact structure is located above the dielectric capping layer and the upper portion of the volume expanded electrically conductive structure, wherein the contact structure is embedded in a second dielectric material layer. In some embodiments, a gap is located beneath the dielectric capping layer. When present, the gap separates the dielectric capping layer from a surface of the lower portion of the volume expanded electrically conductive structure embedded in the first dielectric material layer.

In another aspect of the present application, a method of forming a semiconductor structure is provided. In one embodiment, the method includes providing an electrically conductive structure embedded in a first dielectric material layer. A dielectric capping layer is formed on the first dielectric material layer, wherein the dielectric capping layer has a contact/via opening that physically exposes a surface of the electrically conductive structure. A volume expansion anneal is performed to cause volume expansion of the electrically conductive structure and formation of a volume expanded electrically conductive structure, wherein the volume expanded electrically conductive structure has a lower portion embedded in the first dielectric material layer, and an upper portion that is at least partially included in a lower portion of the contact/via opening. A contact structure is formed above the dielectric capping layer, wherein the contact structure is embedded in a second dielectric material layer.

DETAILED DESCRIPTION

Figure 1:
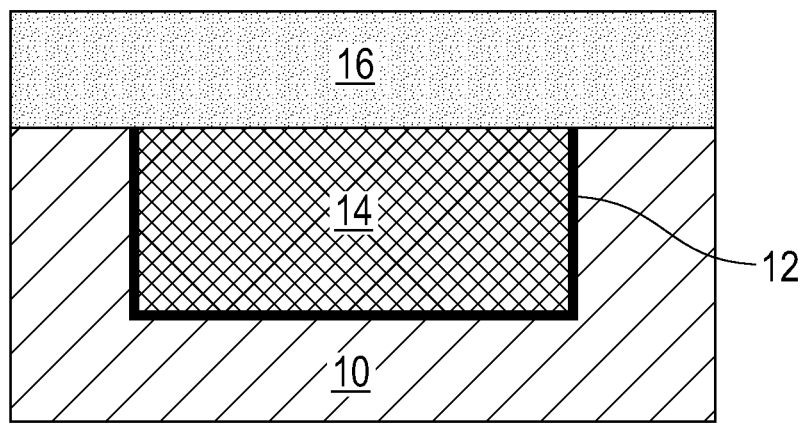
FIG. 1 is a cross sectional view of an exemplary semiconductor structure in accordance with the present application and during an early stage of fabrication, wherein the exemplary semiconductor structure includes a dielectric capping layer located on a surface of a lower level containing an electrically conductive structure embedded in a first dielectric material layer.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring first to FIG. 1, there is illustrated an exemplary semiconductor structure in accordance with the present application and during an early stage of fabrication. The exemplary semiconductor structure of FIG. 1 includes a dielectric capping layer 16 located on a surface of a lower level containing an electrically conductive structure 14 embedded in a first dielectric material layer 10. In some embodiments, the electrically conductive structure 14 may be referred to as an interconnect structure. In other embodiments, the electrically conductive structure may be referred to as a lower contact structure.

In some embodiments and as is illustrated in FIG. 1, a first diffusion barrier liner 12 can be present between the electrically conductive structure 14 and the first dielectric material layer 10. That is, the first diffusion barrier liner 12 is located on the sidewalls and the bottom wall (i.e., bottommost surface) of the electrically conductive structure 14 that is embedded in the first dielectric material layer 10. In other embodiments (not shown), the first diffusion barrier liner 12 may be omitted from the exemplary structure of the present application. It is noted that although the present application describes and illustrates a single electrically conductive structure 14 embedded in the first dielectric material layer 10, the present application works when a plurality of electrically conductive structures 14 are embedded in the first dielectric material layer 10.

In some embodiments, the lower level including the electrically conductive structure 14 embedded in a first dielectric material layer 10 may be a first interconnect level of a multilevel interconnect structure. In other embodiments, the lower level including the electrically conductive structure 14 embedded in a first dielectric material layer 10 is present in a multilayered interconnect structure in which at least one other interconnect level is located beneath the lower level that includes the electrically conductive structure 14 embedded in the first dielectric material layer 10. In yet another embodiment, the lower level including the electrically conductive structure 14 embedded in a first dielectric material layer 10 is a middle-of-the-line (MOL) level.

In any of the aforementioned embodiments, a front-end-of-the-line (FEOL) level (not shown) is located beneath the lower level that includes the electrically conductive structure 14 embedded in the first dielectric material layer 10. The FEOL level includes a semiconductor substrate having one or more semiconductor devices such as, for example, transistors, capacitors, resistors, and etc. located thereon.

The electrically conductive structure 14 and, if present, the first diffusion barrier liner 12 have topmost surfaces that are coplanar with each other as well as coplanar with a topmost surface of the first dielectric material layer 10. In some embodiments, the electrically conductive structure 14 may extend through the entire thickness of the first dielectric material layer 10.

The first dielectric material layer 10 of the lower interconnect level may be composed of an inorganic dielectric material or an organic dielectric material. In some embodiments, the first dielectric material layer 10 may be porous. In other embodiments, the first dielectric material layer 10 may be non-porous. Examples of suitable dielectric materials that may be employed as the first dielectric material layer 10 include, but are not limited to, silicon dioxide, undoped or doped silicate glass, silsesquioxanes, C doped oxides (i.e., organosilicates) that include atoms of Si, C, O and H, thermosetting polyarylene ethers or any multilayered combination thereof. The term "polyarylene" is used in this present application to denote aryl moieties or inertly substituted aryl moieties which are linked together by bonds, fused rings, or inert linking groups such as, for example, oxygen, sulfur, sulfone, sulfoxide, or carbonyl.

In some embodiments, the first dielectric material layer 10 may have a dielectric constant (all dielectric constants mentioned herein are measured relative to a vacuum, unless otherwise stated) that is about 4.0 or less. In one example, the first dielectric material layer 10 can have a dielectric constant of 2.8 or less. These dielectrics generally having a lower parasitic cross talk as compared to dielectric materials whose dielectric constant is greater than 4.0.

The first dielectric material layer 10 can be formed by a deposition process such as, for example, chemical vapor deposition (CVD), plasma enhanced chemical vapor deposition (PECVD) or spin-on coating. The first dielectric material layer 10 can have a thickness from 50 nm to 250 nm. Other thicknesses that are lesser than 50 nm, and greater than 250 nm can also be employed in the present application.

After providing the first dielectric material layer 10, at least one opening (not shown) is formed into the first dielectric material layer 10; each opening will house an electrically conductive structure and, if present, a first diffusion barrier liner. In the present application, the at least one opening that is formed in the first dielectric material layer 10 may be a line opening or a combined via/line opening in which the via portion of the combined via/line opening is located beneath the line portion of the combined via/line opening. The at least one opening may be formed by lithography and etching. In embodiments in which a combined via/line opening is formed, a second iteration of lithography and etching may be used to form such an opening.

In some embodiments, a first diffusion barrier material is then formed within the at least one opening and on an exposed topmost surface of the first dielectric material layer 10; the first diffusion barrier material will provide the first diffusion barrier liner 12 mentioned above. The first diffusion barrier material may include Ta, TaN, Ti, TiN, Ru, RuN, RuTa, RuTaN, W, WN or any other material that can serve as a barrier to prevent a conductive material from diffusing there through. The thickness of the first diffusion barrier material may vary depending on the deposition process used as well as the material employed. In some embodiments, the first diffusion barrier material may have a thickness from 2 nm to 50 nm; although other thicknesses for the diffusion barrier material are contemplated and can be employed in the present application as long as the first diffusion barrier material does not entirely fill the opening. The first diffusion barrier material can be formed by a deposition process including, for example, chemical vapor deposition (CVD), plasma enhanced chemical vapor deposition (PECVD), atomic layer deposition (ALD), physical vapor deposition (PVD), sputtering, chemical solution deposition or plating.

In some embodiments, an optional plating seed layer (not specifically shown) can be formed on the surface of the first diffusion barrier material. In cases in which the conductive material to be subsequently and directly formed on the first diffusion barrier material, the optional plating seed layer is not needed. The optional plating seed layer is employed to selectively promote subsequent electroplating of a preselected conductive metal or metal alloy. The optional plating seed layer may be composed of Cu, a Cu alloy, Ir, an Ir alloy, Ru, a Ru alloy (e.g., TaRu alloy) or any other suitable noble metal or noble metal alloy having a low metal-plating overpotential. Typically, Cu or a Cu alloy plating seed layer is employed, when a Cu metal is to be subsequently formed within the at least one opening. The thickness of the optional plating seed layer may vary depending on the material of the optional plating seed layer as well as the technique used in forming the same. Typically, the optional plating seed layer has a thickness from 2 nm to 80 nm. The optional plating seed layer can be formed by a conventional deposition process including, for example, CVD, PECVD, ALD, or PVD.

An electrically conductive metal or metal alloy is formed into each opening and, if present, atop the first diffusion barrier material. The electrically conductive metal or metal alloy provides the electrically conductive structure 14 of the present application. The electrically conductive metal or metal alloy may be composed of copper (Cu), aluminum (Al), tungsten (W), cobalt (Co), ruthenium (Ru), nickel (Ni), iridium (Ir), rhodium (Rh) or an alloy thereof such as, for example, a Cu—Al alloy. The electrically conductive metal or metal alloy can be formed utilizing a deposition process such as, for example, CVD, PECVD, sputtering, chemical solution deposition or plating. In one embodiment, a bottom-up plating process is employed in forming the electrically conductive metal or metal alloy. In some embodiments, the electrically conductive metal or metal alloy is formed above the topmost surface of the first dielectric material layer 10.

Following the deposition of the electrically conductive metal or metal alloy, a planarization process such as, for example, chemical mechanical polishing (CMP) and/or grinding, can be used to remove all portions of the electrically conductive metal or metal alloy (i.e., overburden material) that are present outside each of the openings forming the electrically conductive structure 14. The planarization stops on a topmost surface of the first dielectric material layer 10. If present, the planarization process also removes the first diffusion barrier material from the topmost surface of the first dielectric material layer 10. The remaining portion of the first diffusion barrier material that is present in the at least one opening is referred to herein as the first diffusion barrier liner 12, while the remaining electrically conductive metal or metal alloy that is present in the at least one opening may be referred to as the electrically conductive structure 14. Collectively, the first dielectric material layer 10, if present, the first diffusion barrier liner 12, and electrically conductive structure 14 define the lower interconnect level of the present application.

Dielectric capping layer 16 is formed on the physically exposed topmost surface of the lower interconnect level of the present application. The dielectric capping layer 18 may include any dielectric capping material including, for example, silicon carbide (SiC), silicon nitride ($Si_3N_4$), silicon dioxide ($SiO_2$), a carbon doped oxide, a nitrogen and hydrogen doped silicon carbide (SiC(N,H)) or a multilayered stack of at least one of the aforementioned dielectric capping materials. In one embodiment, and when a liner free contact/via structure is to be formed, the dielectric capping layer 16 is composed of SiC(N,H). The dielectric capping material that provides the dielectric capping layer 16 may be formed utilizing a deposition process such as, for example, CVD, PECVD, ALD, chemical solution deposition or evaporation. Dielectric capping layer 16 may have a thickness from 10 nm to 100 nm. Other thicknesses that are lesser than 10 nm, or greater than 100 nm may also be used as the thickness of the dielectric capping layer 16.

Figure 2:
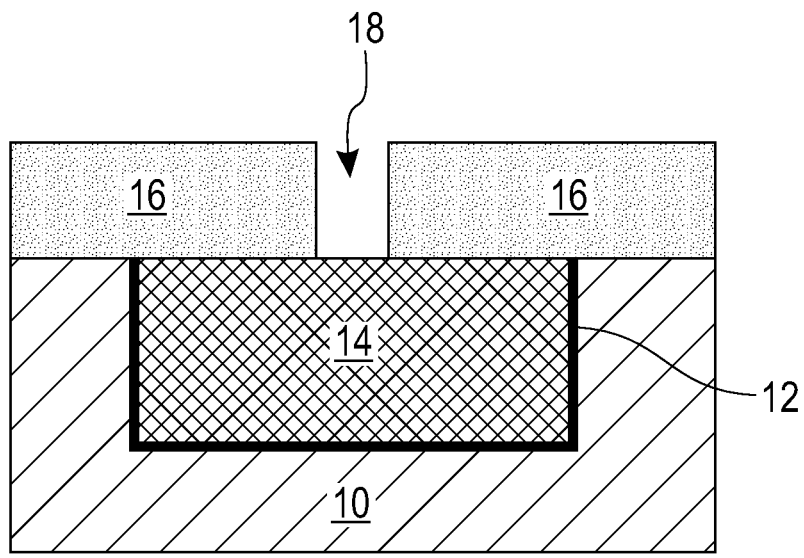
FIG. 2 is a cross sectional view of the exemplary semiconductor structure of FIG. 1 after forming a contact/via opening into the dielectric capping layer that physically exposes a surface of the electrically conductive structure.

Referring to FIG. 2, there is illustrated the exemplary semiconductor structure of FIG. 1 after forming a contact/via opening 18 into the dielectric capping layer 16 that physically exposes a surface of the electrically conductive structure 14. The contact/via opening 18 can be formed by lithography and etching. The contact/via opening 18 has a width that is less than the width of the underlying electrically conductive structure 14. In one example, the contact/via opening 18 has a width from 10 nm to 100 nm.

Referring now to FIGS. 3A, 3B, 3C and 3D, there are shown the exemplary semiconductor structure of FIG. 2 after performing an anneal to cause volume expansion (hereinafter "volume expansion anneal") of the electrically conductive structure in accordance with various embodiments of the present application.

Figure 3A:
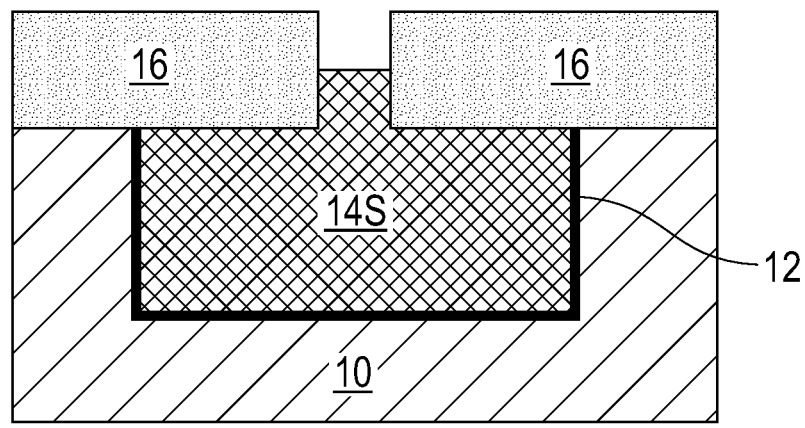
FIG. 3A is a cross sectional view of the exemplary semiconductor structure of FIG. 2 after performing an anneal to cause volume expansion of the electrically conductive structure in accordance with a first embodiment of the present application.

Notably, FIG. 3A shows the exemplary semiconductor structure of FIG. 2 after performing the volume expansion anneal in accordance with a first embodiment of the present application. In this illustrated first embodiment, the volume expansion anneal causes partial expansion of the electrically conductive structure 14 into a lower portion of the contact/via opening 18, while maintaining the complete volume of the electrically conductive structure embedded in the first dielectric material layer 10. In the drawings, element 14S denotes a volume expanded electrically conductive structure. The term "volume expanded electrically conductive structure 14S" denotes an electrically conductive structure having in at least one area that is greater than the original thickness of the electrical conductive structure 14 in the same area prior to performing the volume expansion anneal. In the embodiments, shown in FIG. 3A, the volume expanded electrically conductive structure 14S has a topmost surface that is located above the topmost surface of the first dielectric material layer 10 and below a topmost surface of the dielectric capping layer 16.

Figure 3B:
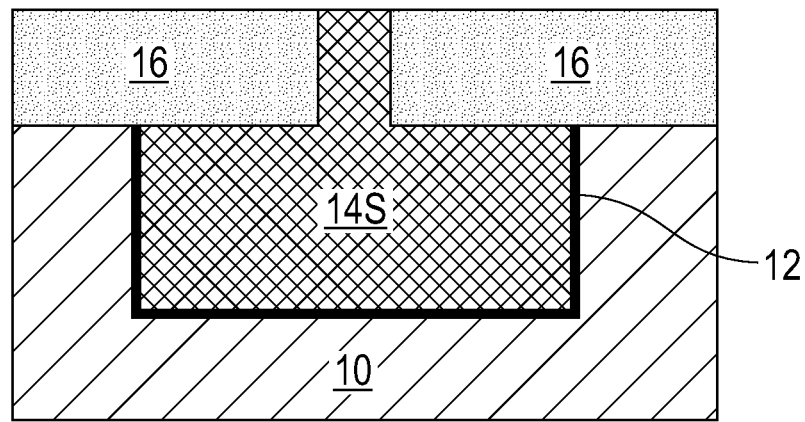
FIG. 3B is a cross sectional view of the exemplary semiconductor structure of FIG. 2 after performing an anneal to cause volume expansion of the electrically conductive structure in accordance with a second embodiment of the present application.

FIG. 3B shows the exemplary semiconductor structure of FIG. 2 after performing the volume expansion anneal in accordance with a second embodiment of the present application. In this illustrated second embodiment, the volume expansion anneal causes expansion of the electrically conductive structure 14 into and completely filling the contact/via opening 18, while maintaining the complete volume of the electrically conductive structure embedded in the first dielectric material layer 10. In some embodiments, the volume expanded electrically conductive structure 14S of this embodiment of the present application may have a topmost surface that is coplanar with a topmost surface of the dielectric capping layer 16.

Figure 3C:
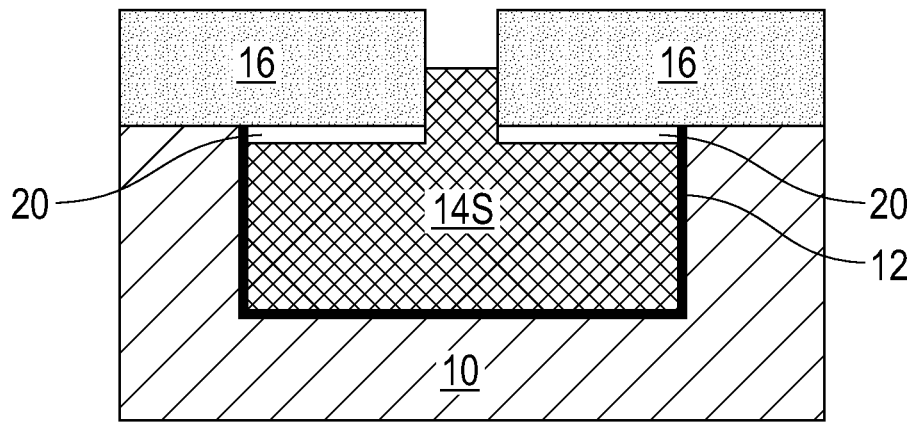
FIG. 3C is a cross sectional view of the exemplary semiconductor structure of FIG. 2 after performing an anneal to cause volume expansion of the electrically conductive structure in accordance with a third embodiment of the present application.

FIG. 3C shows the exemplary semiconductor structure of FIG. 2 after performing the volume expansion anneal in accordance with a third embodiment of the present application. In this illustrated third embodiment, the volume expansion anneal causes partial expansion of the electrically conductive structure 14 into a lower portion of the contact/via opening 18, while causing a loss of volume of the original electrically conductive structure 14 embedded in the first dielectric material layer 10 and subsequent formation of gap 20 beneath the dielectric capping layer 18. In the embodiments, shown in FIG. 3C, the volume expanded electrically conductive structure 14S has a topmost surface that is located above the topmost surface of the first dielectric material layer 10 and below a topmost surface of the dielectric capping layer 16.

Figure 3D:
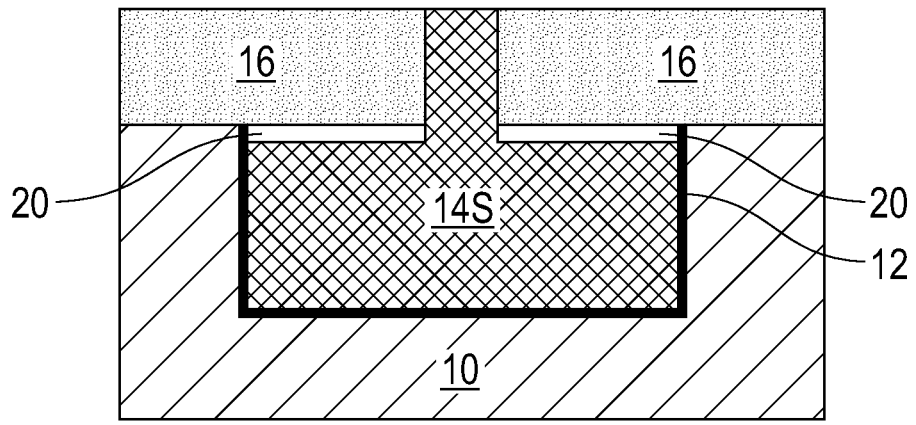
FIG. 3D is a cross sectional view of the exemplary semiconductor structure of FIG. 2 after performing an anneal to cause volume expansion of the electrically conductive structure in accordance with a fourth embodiment of the present application.

FIG. 3D shows the exemplary semiconductor structure of FIG. 2 after performing the volume expansion anneal in accordance with a fourth embodiment of the present application. In this illustrated fourth embodiment, the volume expansion anneal causes expansion of the electrically conductive structure 14 into and completely filling the contact/via opening 18, while causing a loss of volume of the original electrically conductive structure 14 embedded in the first dielectric material layer 10 and subsequent formation of gap 20 beneath the dielectric capping layer 18. In some embodiments, the volume expanded electrically conductive structure 14S of this embodiment of the present application may have a topmost surface that is coplanar with a topmost surface of the dielectric capping layer 16.

In the present application, and during the volume expansion anneal, capillary force is used to drive the electrically conductive metal or metal alloy of the original electrically conductive structure 14 into the contact/via opening 18. In one embodiment, the volume expansion anneal is performed at a temperature from 100° C. to 500° C. In another embodiment, the volume expansion anneal is performed at a temperature from 200° C. to 400° C. The duration of the anneal may vary. In one embodiment, the duration of the volume expansion anneal is from 30 seconds to 2 hours. In another embodiment, the duration of the volume expansion anneal is from 1 minute to 1 hour. The volume expansion anneal may, in some embodiments, be performed in an inert ambient such as, for example, helium (He), argon (Ar), neon (Ne), nitrogen ($N_2$) or mixtures thereof. In other embodiments, a forming gas (i.e., a nitrogen and hydrogen gas mixture) is employed.

The type of volume expanded electrically conductive structure 14S that is formed in the present application is dependent upon the type of electrically conductive metal or metal alloy that provides the electrically conductive structure 14 as well as the conditions (temperature and/or time) of the volume expansion anneal that are employed.

Figure 4:
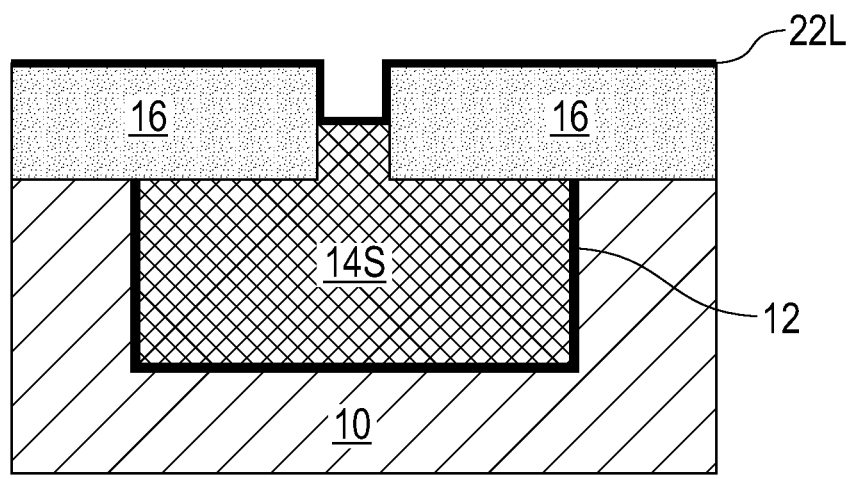
FIG. 4 is a cross sectional view of the exemplary semiconductor structure of FIG. 3A after forming a contact/via diffusion barrier material layer.

Referring now to FIG. 4, there is shown the exemplary semiconductor structure of FIG. 3A after forming a contact/via diffusion barrier material layer 22L. As is illustrated for this embodiment of the present application, contact/via diffusion barrier material layer 22L is formed on the physically exposed surfaces (i.e., topmost and sidewall) of the dielectric capping layer 16 as well as a topmost surface of the volume expanded electrically conductive structure 14S.

The contact/via diffusion barrier material layer 22L may include one of the diffusion barrier materials mentioned above for the first diffusion barrier liner 12. The contact/via diffusion barrier material layer 22L may be formed utilizing one of the deposition processes mentioned above for forming the diffusion barrier material that provides the first diffusion barrier liner 12. The contact/via diffusion barrier material layer 22L may have a thickness that is within the thickness range mentioned above for the first diffusion barrier material layer that provides the first diffusion barrier liner 12.

Figure 5:
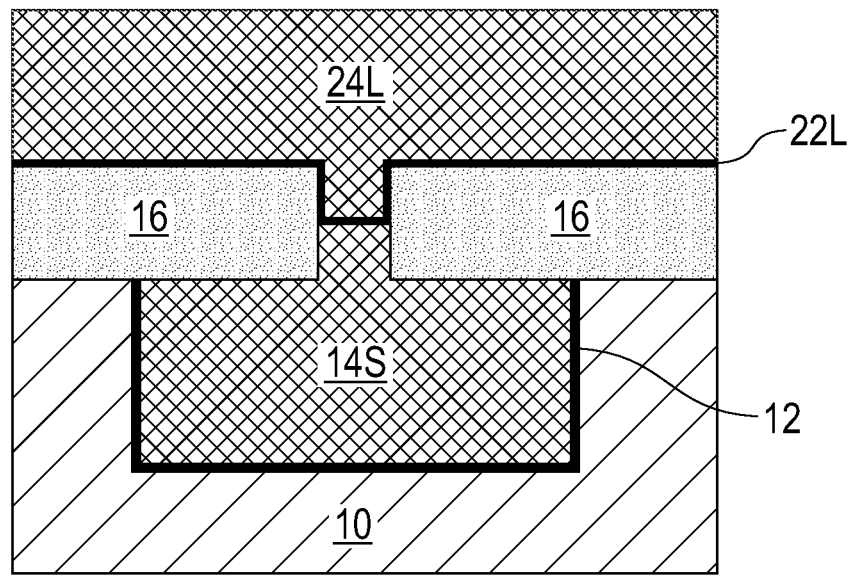
FIG. 5 is a cross sectional view of the exemplary semiconductor structure of FIG. 4 after forming a contact metal or metal alloy layer on the contact/via diffusion barrier material layer.

Referring now to FIG. 5, there is illustrated the exemplary semiconductor structure of FIG. 4 after forming a contact metal or metal alloy layer 24L on the contact/via diffusion barrier material layer 22L. As is shown, the contact metal or metal alloy layer 24L fills in the remaining portion of the contact/via opening 18, and a portion (i.e., overburden portion) of the contact metal or metal alloy layer 24L is present above the topmost surface of the dielectric capping layer 18.

The contact metal or metal alloy layer 24L may include one of the electrically conductive metals or metal alloys described above for the electrically conductive structure 14. In one embodiment, the contact metal or metal alloy layer 24L is composed of a same electrically conductive metal or metal alloy as the electrically conductive structure 14. In one example, the contact metal or metal alloy layer 24L and the electrically conductive structure 14 are both composed of copper. In another embodiment, the contact metal or metal alloy layer 24L is composed of a different electrically conductive metal or metal alloy than the electrically conductive structure 14. In one example, the contact metal or metal alloy layer 24L is composed of cobalt, while the electrically conductive structure 14 is composed of copper.

The contact metal or metal alloy layer 24L can be formed utilizing one of the deposition processes mentioned above for forming the electrically conductive metal or metal alloy that provides the electrically conductive structure 14. In some embodiments, a plating seed layer, as defined above, may be formed prior to forming the contact metal or metal alloy layer 24L. The contact metal or metal alloy layer 24L can have a thickness from 50 nm to 500 nm; other thicknesses are possible and are not excluded from being used in the present application as long as the selected thickness is sufficient to fill in the remaining upper portion of the contact/via opening 18.

Figure 6:
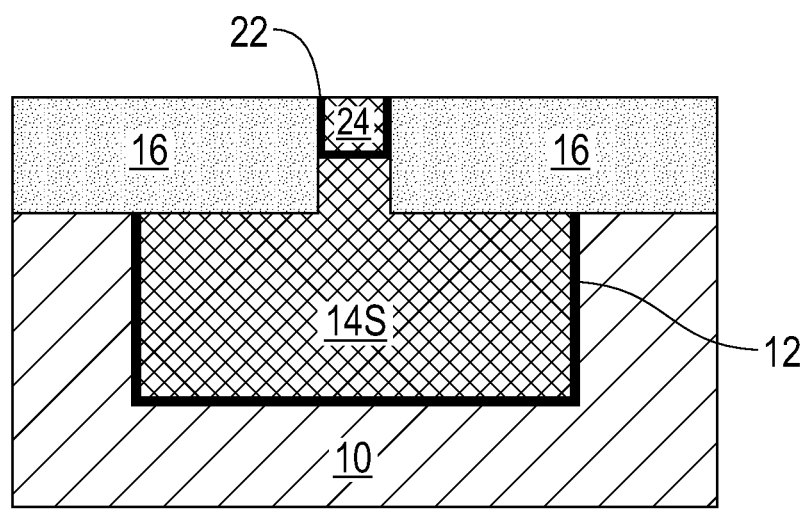
FIG. 6 is a cross sectional view of the exemplary semiconductor structure of FIG. 5 after performing a planarization process to remove the contact/via diffusion barrier material layer and the contact metal or metal alloy layer from the topmost surface of the dielectric capping layer, wherein a portion of the contact/via diffusion barrier material layer (hereinafter the contact/via diffusion barrier liner) and a portion of the contact metal or metal alloy layer (hereinafter contact/via structure) remain in the contact/via opening after performing the planarization process.

Referring now to FIG. 6, there is illustrated the exemplary semiconductor structure of FIG. 5 after performing a planarization process to remove the contact/via diffusion barrier material layer 22L and the contact metal or metal alloy 24L from the topmost surface of the dielectric capping layer 16, wherein a portion of the contact/via diffusion barrier material layer 22L (hereinafter the contact/via diffusion barrier liner 22) and a portion of the contact metal or metal alloy layer 24L (hereinafter contact/via structure 24) remain in the contact/via opening 18 after performing the planarization process. The planarization process may include chemical mechanical polishing and/or grinding. After planarization, the via contact diffusion barrier liner 22 and the via contact structure 24 have topmost surfaces that are coplanar with each other, as well as being coplanar with a topmost surface of the dielectric capping layer 16.

In this embodiment of the present application, and as is shown in FIG. 6, a contact/via diffusion barrier liner 22 and a contact/via structure 24 are present in an upper portion of the contact/via opening 18, while a portion of the volume expanded electrically conductive structure 14S is present in a lower portion of the contact/via structure. In this embodiment, the upper portion of the contact/via opening 18 includes a diffusion barrier liner, while the lower portion of the contact/via opening is diffusion barrier liner free. Such as structure may be referred to herein as a partial liner (diffusion barrier) free contact/via structure.

Figure 7:
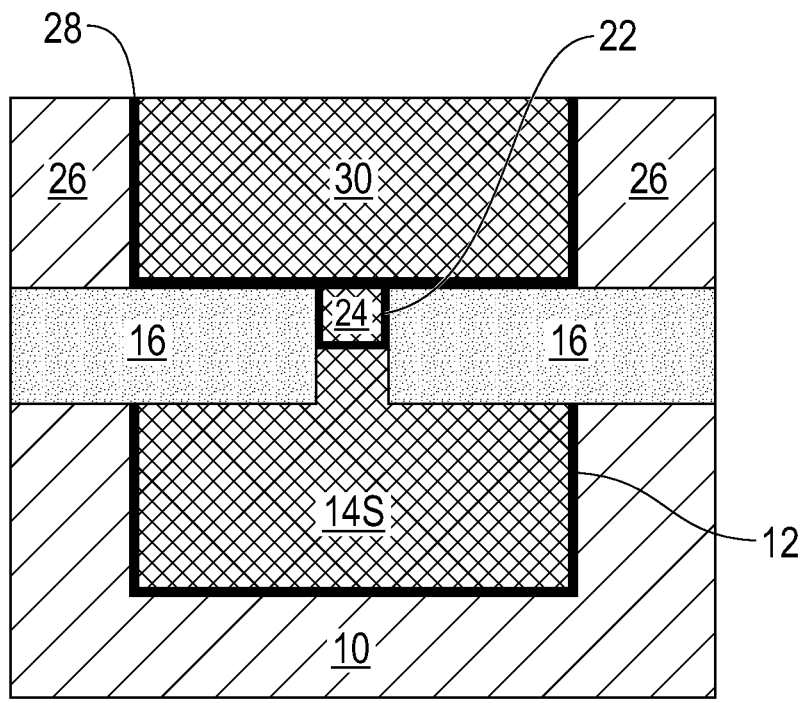
FIG. 7 is a cross sectional view of the exemplary semiconductor structure of FIG. 6 after forming a second dielectric material layer above the dielectric capping layer, wherein a contact structure is embedded in the second dielectric material layer.

Referring now to FIG. 7, there illustrated the exemplary semiconductor structure of FIG. 6 after forming a second dielectric material layer 26 above the dielectric capping layer 16, wherein a contact structure 30 is embedded in the second dielectric material layer 26. In some embodiments, a second diffusion barrier liner 28 may also be embedded in the second dielectric material layer 26. In such an embodiment, the second diffusion barrier liner 28 is located on the sidewalls and bottommost wall of the contact structure 30. Collectively, the second dielectric material layer 26, if present, the second diffusion barrier liner 28, and the contact structure 30 provide an upper level of the exemplary semiconductor structure of the present application. In the exemplary structure of FIG. 7, contact/via diffusion barrier 22 or contact/via structure 24 are present in an upper portion of the contact/via opening 18.

This upper level is separated from the lower level by the dielectric capping layer 16, and the partial liner (diffusion barrier) free contact/via structure electrically connects the two levels together. The upper level is formed by first providing the second dielectric material layer 26. The second dielectric material layer 26 may include one of the dielectric materials mentioned above for the first dielectric material layer 10; the first and second dielectric material layers have a different composition than the dielectric capping layer 16. In one embodiment, the second dielectric material layer 26 is composed of a same dielectric material as the first dielectric material layer 10. In another embodiment, the second dielectric material layer 26 is composed of a different dielectric material than the first dielectric material layer 10. The second dielectric material layer 26 can be formed utilizing one of the techniques mentioned above for forming the first dielectric material layer 10. The second dielectric material layer 26 may have a thickness within the range mentioned above for the first dielectric material layer 10.

An opening is then formed into the deposited second dielectric material layer 26 utilizing lithography and etching. The opening that is provided into the second dielectric material layer 26 has a width that is greater than the width of the contact/via opening 18. The width of the opening that is provided into the second dielectric material layer 26 may be the same as, or different from, the width of the opening formed into the first dielectric material layer.

In one embodiment of the present application, a second diffusion barrier material layer is formed into the opening provided into the second dielectric material layer 26. In some embodiments, the formation of the second diffusion barrier layer is omitted. The second diffusion barrier material layer may include one of the diffusion barrier materials mentioned above for the first diffusion barrier material that provides the first diffusion barrier liner 12. In one embodiment, the second diffusion barrier layer, the contact/via diffusion barrier layer 22L, and the first diffusion barrier material are composed of a same diffusion barrier material. In another embodiment, at least one of the second diffusion barrier layer, the contact/via diffusion barrier layer 22L, and the first diffusion barrier material is composed of a different diffusion barrier material.

In some embodiments, a second electrically metal or metal alloy layer is formed within the second opening and above the second dielectric material layer 26. The second electrically conductive metal or metal alloy layer may include one of the electrically conductive metals or metal alloys mentioned above for providing the electrically conductive structure 14. In one embodiment, the second electrically conductive metal or metal alloy layer is composed of a same electrically conductive metal or metal alloy as the electrically conductive structure 14. In another embodiment, the second electrically conductive metal or metal alloy layer is composed of a different electrically conductive metal or metal alloy as the electrically conductive structure 14. Also, the second electrically conductive metal alloy layer may be composed of a same, or a different, electrically conductive metal or metal alloy as the contact metal or metal alloy layer 24L. The second electrically conductive metal or metal alloy layer may be formed utilizing one of the deposition processes used to provide the first electrically conductive metal or metal alloy layer.

Following the formation of the second electrically conductive metal or metal alloy layer, a planarization process is performed that removes the second electrically conductive metal or metal alloy layer and, if present, the second diffusion barrier material layer, from atop the second dielectric material. A portion of the second electrically conductive metal or metal alloy layer and, if present, a portion of the second diffusion barrier layer remain in the second opening. The remaining second diffusion barrier layer that remains in the second opening provides the second diffusion barrier liner 28, while the remaining portion of the second electrically conductive metal or metal alloy within the second opening provides the contact structure 30 (contact structure 30 may be referred to a non via contact structure).

In some embodiments, the contact structure 30 is a non-volatile memory such as, for example, a ferroelectric memory (FE) device, a resistive random access memory (ReRAM) device, a magnetoresistive random access memory (MRAM) device, or a phase change random access memory (PRAM) device.

In one embodiment of the present application, materials for the contact structure 30 are deposited after FIG. 6, and thereafter the deposited materials are patterned. Second dielectric material layer 26 is then deposited and planarized.

A FE memory device is a random access memory similar in construction to a DRAM by using a ferroelectric layer instead of a dielectric layer to achieved non-volatility. FE memory devices typically include a material stack of, from bottom to top, a bottom electrode, a ferroelectric layer, and a top electrode. The bottom and top electrodes may be composed of a metal or metal nitride. For example, TiN may be used as the material for both the bottom and top electrodes. The ferroelectric layer is composed of one or more ferroelectric materials exhibiting ferroelectricity (i.e., a material that has a spontaneous electric polarization that can be reversed by the application of an external electric field). Examples of ferroelectric materials that can be used as the ferroelectric layer include, but at not limited to, mixed metal oxides such as, $BaTiO_3$, $Pb(Zr_xTi_{1-x})O_3$ (0.1<x<1), or crystalline $HfO_2$ with, or without, a doping element selected from Zr, Al, Ca, Ce, Dy, Er, Gd, Ge, La, Sc, Si, Sr, Sn, C, N, and Y. The FE material stack can be formed by deposition of the various material layers.

A ReRAM device is a random access memory that typically includes a material stack of, from bottom to top, a bottom electrode, a metal oxide that can exhibit a change in electron localization, and a top electrode. The bottom and top electrodes may be composed of a metal or metal nitride. For example, TiN may be used as the material for both the bottom and top electrodes. The metal oxide may include oxides of nickel, zirconium, hafnium, iron, or copper. The ReRAM material stack can be formed by deposition of the various material layers.

A MRAM device is a random access memory, that includes a magnetic tunnel junction (MTJ) structure The magnetic tunnel junction (MTJ) structure may include a reference layer, a tunnel barrier, and a free layer. The reference layer has a fixed magnetization. The reference layer may be composed of a metal or metal alloy that includes one or more metals exhibiting high spin polarization. In alternative embodiments, exemplary metals for the formation of the reference layer include iron, nickel, cobalt, chromium, boron, and manganese. Exemplary metal alloys may include the metals exemplified by the above. In another embodiment, the reference layer may be a multilayer arrangement having (1) a high spin polarization region formed from of a metal and/or metal alloy using the metals mentioned above, and (2) a region constructed of a material or materials that exhibit strong perpendicular magnetic anisotropy (strong PMA). Exemplary materials with strong PMA that may be used include a metal such as cobalt, nickel, platinum, palladium, iridium, or ruthenium, and may be arranged as alternating layers. The strong PMA region may also include alloys that exhibit strong PMA, with exemplary alloys including cobalt-iron-terbium, cobalt-iron-gadolinium, cobalt-chromium-platinum, cobalt-platinum, cobalt-palladium, iron-platinum, and/or iron-palladium. The alloys may be arranged as alternating layers. In one embodiment, combinations of these materials and regions may also be employed.

The tunnel barrier of the MTJ structure is composed of an insulator material and is formed at such a thickness as to provide an appropriate tunneling resistance. Exemplary materials for the tunnel barrier include magnesium oxide, aluminum oxide, and titanium oxide, or materials of higher electrical tunnel conductance, such as semiconductors or low-bandgap insulators.

The free layer of the MTJ structure is composed of a magnetic material with a magnetization that can be changed in orientation relative to the magnetization orientation of the reference layer. Exemplary materials for the free layer of the MTJ structure include alloys and/or multilayers of cobalt, iron, alloys of cobalt-iron, nickel, alloys of nickel-iron, and alloys of cobalt-iron-boron.

The MTJ structure of the MRAM device can be formed by deposition of the various material layers.

A PRAM device is a random access memory that typically includes a material stack of, from bottom to top, a bottom electrode, a phase change memory material that exhibits a change in atomic order (from crystalline to amorphous or vice versa), and a top electrode. The bottom and top electrodes may be composed of a metal or metal nitride. For example, TiN may be used as the material for both the bottom and top electrodes. The phase change memory material may include a chalcogenide glass such as, for example, $Ge_2Sb_2Te_5$ or $Ge_2Bi_2Te_6$. The PRAM stack can be formed by deposition of the various material layers.

Figure 8:
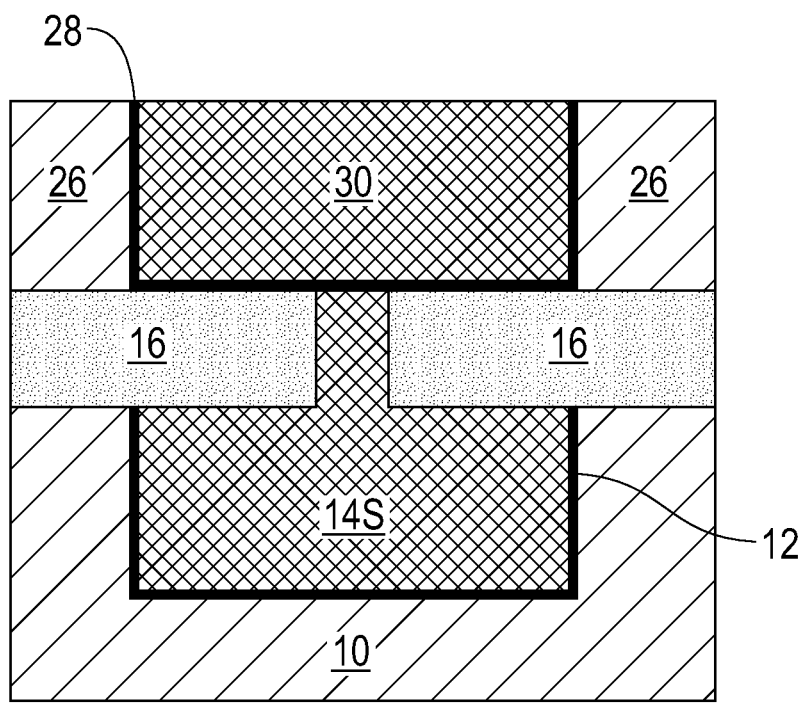
FIG. 8 is a cross sectional view of the exemplary semiconductor structure of FIG. 3B after forming a second dielectric material layer above the dielectric capping layer, wherein a contact structure is embedded in the second dielectric material layer.

Referring now FIG. 8, there is illustrated the exemplary semiconductor structure of FIG. 3B after forming a second dielectric material layer 26 above the dielectric capping layer 16, wherein a contact structure 30 is embedded in the second dielectric material layer 26. An optional second diffusion barrier liner 28, as defined above, may be present as well. The contact structure 30 may include one of the contact structures mentioned above for the embodiment illustrated in FIG. 7 of the present application. The second dielectric material layer 26, is as defined above, and the upper level including the second dielectric material layer 26, optional second diffusion barrier liner 28, and contact structure 30 can be formed as described above in providing the upper level shown in FIG. 7 of the present application. In this structure, no contact/via diffusion barrier or contact/via structure is present in the contact/via opening.

Figure 9:
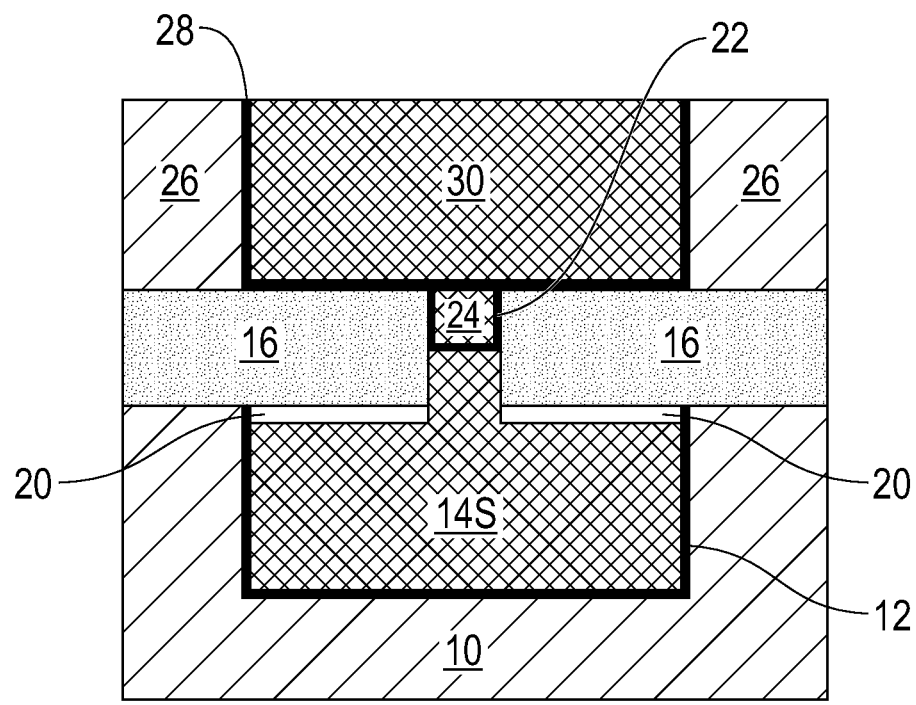
FIG. 9 is a cross sectional view of the exemplary semiconductor structure of FIG. 3C after performing the processing steps shown in FIGS. 4-7.

Referring now to FIG. 9, there is illustrated the exemplary semiconductor structure of FIG. 3C after performing the processing steps shown in FIGS. 4-7. The exemplary structure of FIG. 9 includes a second dielectric material layer 26 above the dielectric capping layer 16, wherein a contact structure 30 is embedded in the second dielectric material layer 26. An optional second diffusion barrier liner 28, as defined above, may be present as well. The contact structure 30 may include one of the contact structures mentioned above for the embodiment illustrated in FIG. 7 of the present application. The second dielectric material layer 26, is as defined above, and the upper level including the second dielectric material layer 26, optional second diffusion barrier liner 28, and contact structure 30 can be formed as described above in providing the upper level shown in FIG. 7 of the present application. The exemplary structure of FIG. 9 is similar to that shown in FIG. 7 in that it includes contact/via diffusion barrier 22 and contact/via structure 24 in an upper portion of the contact/via opening 18. The exemplary structure of FIG. 9 is differs from that shown in FIG. 7 in that it includes gap 20 beneath the dielectric capping layer 16. Gap 20 separates the dielectric capping layer 16 from a surface of the lower portion of the volume expanded electrically conductive structure 14S embedded in the first dielectric material layer 10.

Figure 10:
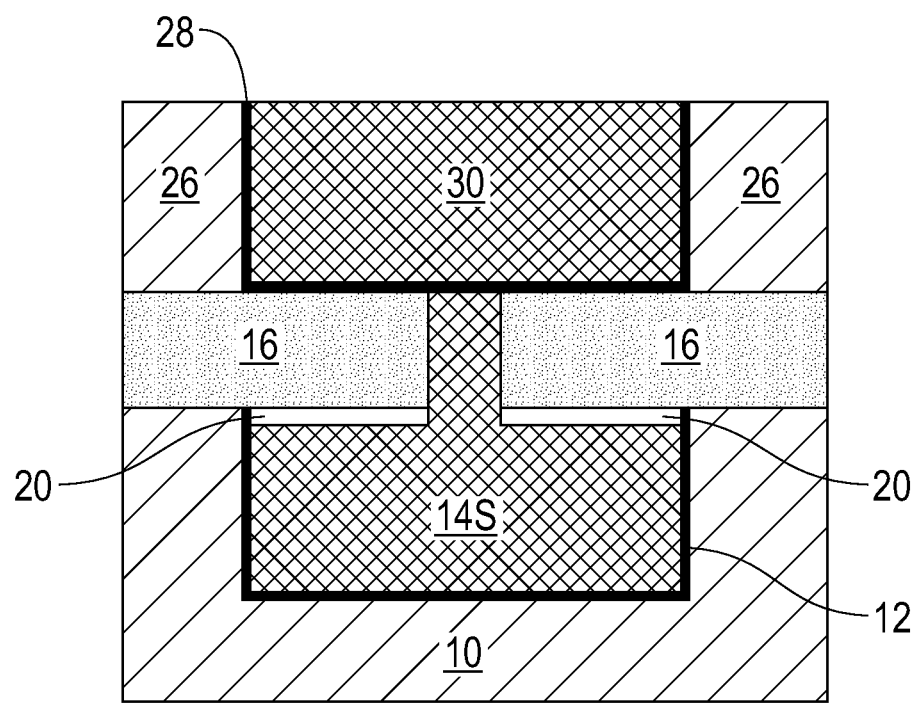
FIG. 10 is a cross sectional view of the exemplary semiconductor structure of FIG. 3D after forming a second dielectric material layer above the dielectric capping layer, wherein a contact structure is embedded in the second dielectric material layer.

Referring now to FIG. 10, there is a cross sectional view of the exemplary semiconductor structure of FIG. 3D after forming a second dielectric material layer 26 above the dielectric capping layer 16, wherein a contact structure 30 is embedded in the second dielectric material layer. An optional second diffusion barrier liner 28, as defined above, may be present as well. The contact structure 30 may include one of the contact structures mentioned above for the embodiment illustrated in FIG. 7 of the present application. The second dielectric material layer 26, is as defined above, and the upper level including the second dielectric material layer 26, optional second diffusion barrier liner 28, and contact structure 30 can be formed as described above in providing the upper level shown in FIG. 7 of the present application. In this structure, no contact/via diffusion barrier or contact/via structure is present in the contact/via opening. The exemplary structure of FIG. 9 includes gap 20 beneath the dielectric capping layer 16. Gap 20 separates the dielectric capping layer 16 from a surface of the lower portion of the volume expanded electrically conductive structure 14S embedded in the first dielectric material layer 10.

Notably, FIGS. 7 and 9 illustrate a semiconductor structure of the present application that includes a lower portion of a volume expanded electrically conductive structure 14S embedded in a first dielectric material layer 10. A dielectric capping layer 16 is located on the first dielectric material layer 10. The dielectric capping layer 16 has a contact/via opening 18 comprising a lower portion and an upper portion, wherein the lower portion of the contact/via opening 18 contains an upper portion of the volume expanded electrically conductive structure 14S. A contact/via diffusion barrier liner 22 and a contact/via structure 24 are present in the upper portion of the contact/via opening 18. A contact structure 30 is located above the dielectric capping layer 16, the contact/via diffusion barrier liner 22, and the contact/via structure 24, wherein the contact structure 30 is embedded in a second dielectric material layer 26. In some embodiments and as shown in FIG. 9, gap 20 is located beneath the dielectric capping layer 16. When present, the gap 20 separates the dielectric capping layer 16 from a surface of the lower portion of the volume expanded electrically conductive structure 14S embedded in the first dielectric material layer 10.

FIGS. 8 and 10 illustrated another semiconductor structure of the present application that includes a lower portion of a volume expanded electrically conductive structure 14S embedded in a first dielectric material layer 10. A dielectric capping layer 16 is located on the first dielectric material layer 10. The dielectric capping layer 16 has a contact/via opening 18 that is entirely filled with an upper portion of the volume expanded electrically conductive structure 14S. A contact structure 20 is located above the dielectric capping layer 16 and the upper portion of the volume expanded electrically conductive structure 14S, wherein the contact structure 30 is embedded in a second dielectric material layer 26. In some embodiments and as shown in FIG. 10, a gap 20 is located beneath the dielectric capping layer 16. When present, the gap 20 separates the dielectric capping layer 16 from a surface of the lower portion of the volume expanded electrically conductive structure 14S embedded in the first dielectric material layer 10.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
   a lower portion of a volume expanded electrically conductive structure embedded in a first dielectric material layer;
   a dielectric capping layer located on the first dielectric material layer, wherein the dielectric capping layer has a contact/via opening comprising a lower portion and an upper portion, wherein the lower portion of the contact/via opening has a same width as the upper portion of the contact/via opening and contains an upper portion of the volume expanded electrically conductive structure which is in direct physical contact with a sidewall of the dielectric capping layer;
   a contact/via diffusion barrier liner and a contact/via structure present in the upper portion of the contact/via opening, wherein the contact/via diffusion barrier liner and the contact/via structure both have a topmost surface that is coplanar with a topmost surface of the dielectric capping layer; and
   a contact structure located above the dielectric capping layer, the contact/via diffusion barrier liner, and the contact/via structure, wherein the contact structure is embedded in a second dielectric material layer.

2. The semiconductor structure of claim 1, wherein the contact structure embedded in the second dielectric material layer comprises an electrically conductive structure.

3. The semiconductor structure of claim 2, further comprising a diffusion barrier liner located on sidewalls and a bottommost surface of the electrically conductive structure embedded in the second dielectric material layer.

4. The semiconductor structure of claim 1, wherein the contact structure embedded in the second dielectric material layer comprises a non-volatile memory device.

5. The semiconductor structure of claim 4, wherein the non-volatile memory device includes a ferroelectric (FE) memory device, a resistive random access memory (ReRAM) device, a magnetoresistive random access memory (MRAM), or a phase change random access memory (PRAM).

6. The semiconductor structure of claim 1, wherein the volume expanded electrically conductive structure, the contact/via structure, and the contact structure embedded in the second dielectric material layer are composed of a same electrically conductive metal or metal alloy.

7. The semiconductor structure of claim 1, wherein the contact structure embedded in the second dielectric material layer has a width that is greater than a width of the contact/via structure present in the upper portion of the contact/via opening.

8. The semiconductor structure of claim 1, wherein the contact/via diffusion barrier liner is located laterally adjacent sidewalls of the contact/via structure and along a bottommost surface of the contact/via structure.

9. A semiconductor structure comprising:
   a lower portion of a volume expanded electrically conductive structure embedded in a first dielectric material layer;
   a dielectric capping layer located on the first dielectric material layer, wherein the dielectric capping layer has a contact/via opening that is entirely filled with an upper portion of the volume expanded electrically conductive structure, wherein the upper portion of the volume expanded electrically conductive structure has a width that is less than a width of the lower portion of the volume expanded electrically conductive structure and a topmost surface that is coplanar with a topmost surface of the dielectric capping layer; and a contact structure located above the dielectric capping layer and the upper portion of the volume expanded electrically conductive structure, wherein the contact structure is entirely embedded in a second dielectric material layer and has a width that is greater than a width of the upper portion of the volume expanded electrically conductive structure.

10. The semiconductor structure of claim 9, wherein the contact structure embedded in the second dielectric material layer comprises an electrically conductive metal or metal alloy structure.

11. The semiconductor structure of claim 10 further comprising a diffusion barrier liner located on sidewalls and a bottommost surface of the electrically conductive metal or metal alloy structure embedded in the second dielectric material layer.

12. The semiconductor structure of claim 9, wherein the contact structure embedded in the second dielectric material layer comprises a non-volatile memory device.

13. The semiconductor structure of claim 12, wherein the non-volatile memory device includes a ferroelectric (FE) memory device, a resistive random access memory (ReRAM) device, a magnetoresistive random access memory (MRAM), or a phase change random access memory (PRAM).

14. The semiconductor structure of claim 9, wherein the volume expanded electrically conductive structure, and the contact structure embedded in the second dielectric material layer are composed of a same electrically conductive metal or metal alloy.

15. The semiconductor structure of claim 9, wherein the dielectric capping layer comprises a nitrogen and hydrogen doped silicon carbide (SiC(N,H)).

* * * * *